United States Patent

Burt et al.

[11] Patent Number: 5,812,693
[45] Date of Patent: Sep. 22, 1998

[54] INTEGRATED MACHINE VISION INSPECTION AND REWORK SYSTEM — CIP

[75] Inventors: Robert G. Burt, Huntsville; Andrejs K. Kalnajs, Madison, both of Ala.

[73] Assignee: Chrysler Corporation, Auburn Hills, Mich.

[21] Appl. No.: 514,939

[22] Filed: Aug. 14, 1995

Related U.S. Application Data

[63] Continuation-in-part of Ser. No. 324,435, Oct. 17, 1994, abandoned.

[51] Int. Cl.[6] .................................................. G06K 9/00
[52] U.S. Cl. ..................... 382/149; 382/147; 382/146; 348/87; 348/129
[58] Field of Search ............................. 382/141, 145–147, 382/149, 151, 184; 348/87, 92, 94, 125, 126, 129, 130; 364/489, 490, 491; 29/720, 721, 740; 198/358, 464, 460

[56] References Cited

U.S. PATENT DOCUMENTS

| | | | |
|---|---|---|---|
| 4,914,513 | 4/1990 | Spigarelli et al. | 348/87 |
| 5,237,622 | 8/1993 | Howell | 382/151 |
| 5,272,761 | 12/1993 | Kanai et al. | 382/147 |
| 5,537,331 | 7/1996 | Shinonaga | 364/490 |

*Primary Examiner*—Christopher S. Kelley
*Attorney, Agent, or Firm*—Jennifer M. Stec

[57] ABSTRACT

An integrated machine vision inspection and rework system is provided for inspecting and reworking printed circuit boards. The system includes an inspection unit that acquires image data of printed circuit boards mounted on a machine framework and a vision computer that processes the image data contained within a chamber in the framework. Also mounted on the framework is a three stage asynchronous conveyor with sensors, and drive and stepping motors that communicate with I/O boards connected to the vision computer. A rework station also mounted on the framework provides a dual reporting scheme, which includes both a laser indicator and a fault display monitor.

13 Claims, 11 Drawing Sheets

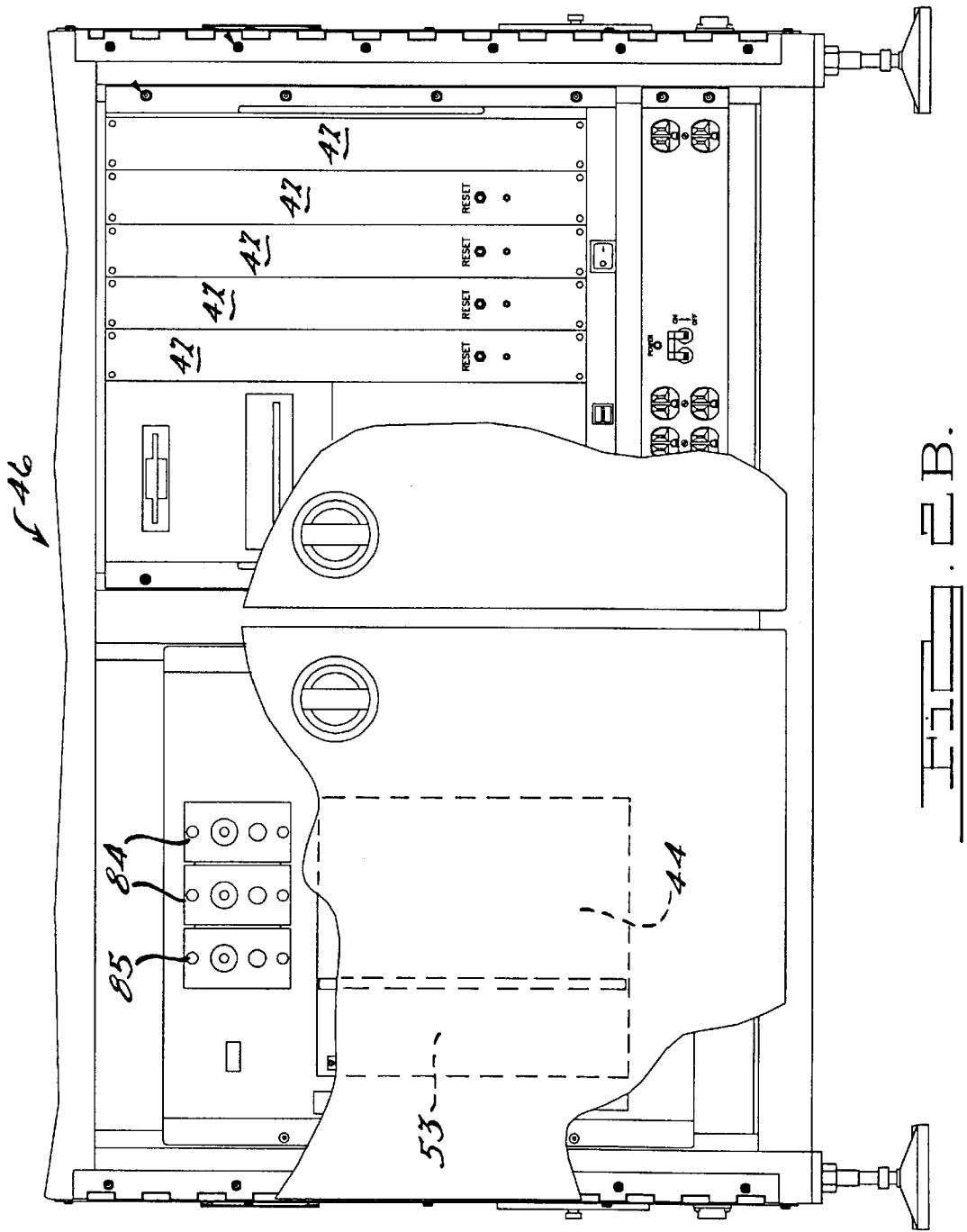

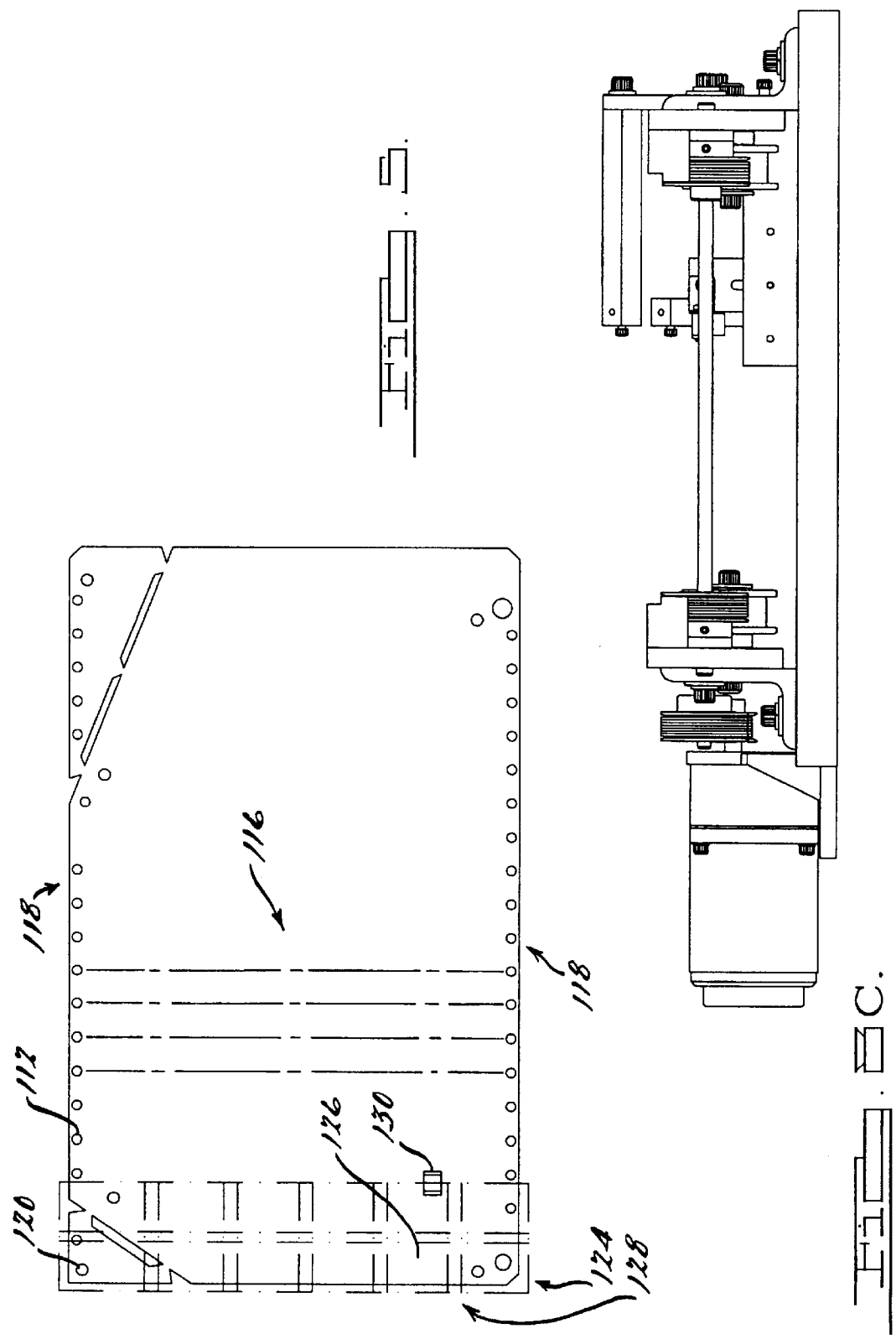

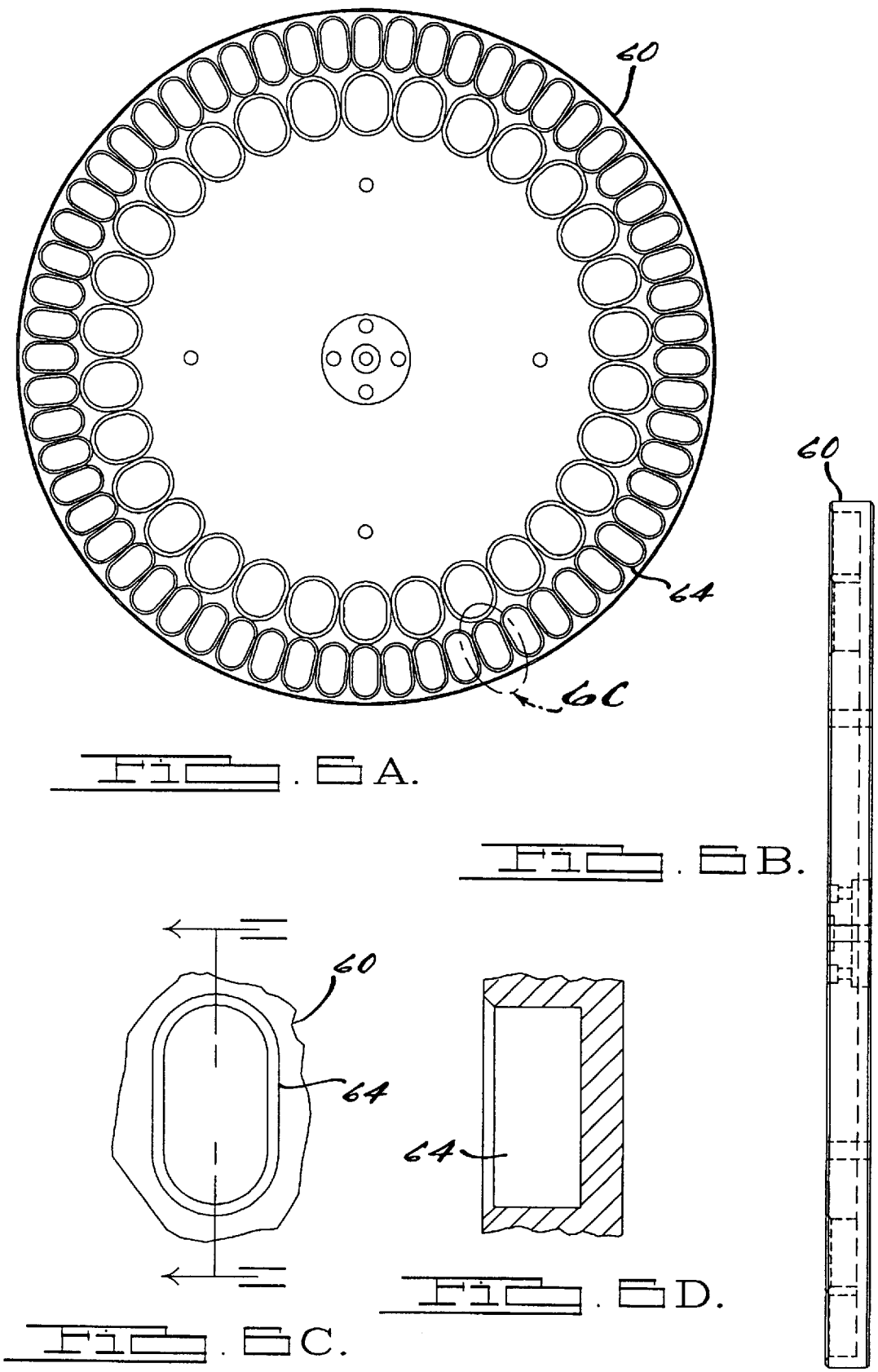

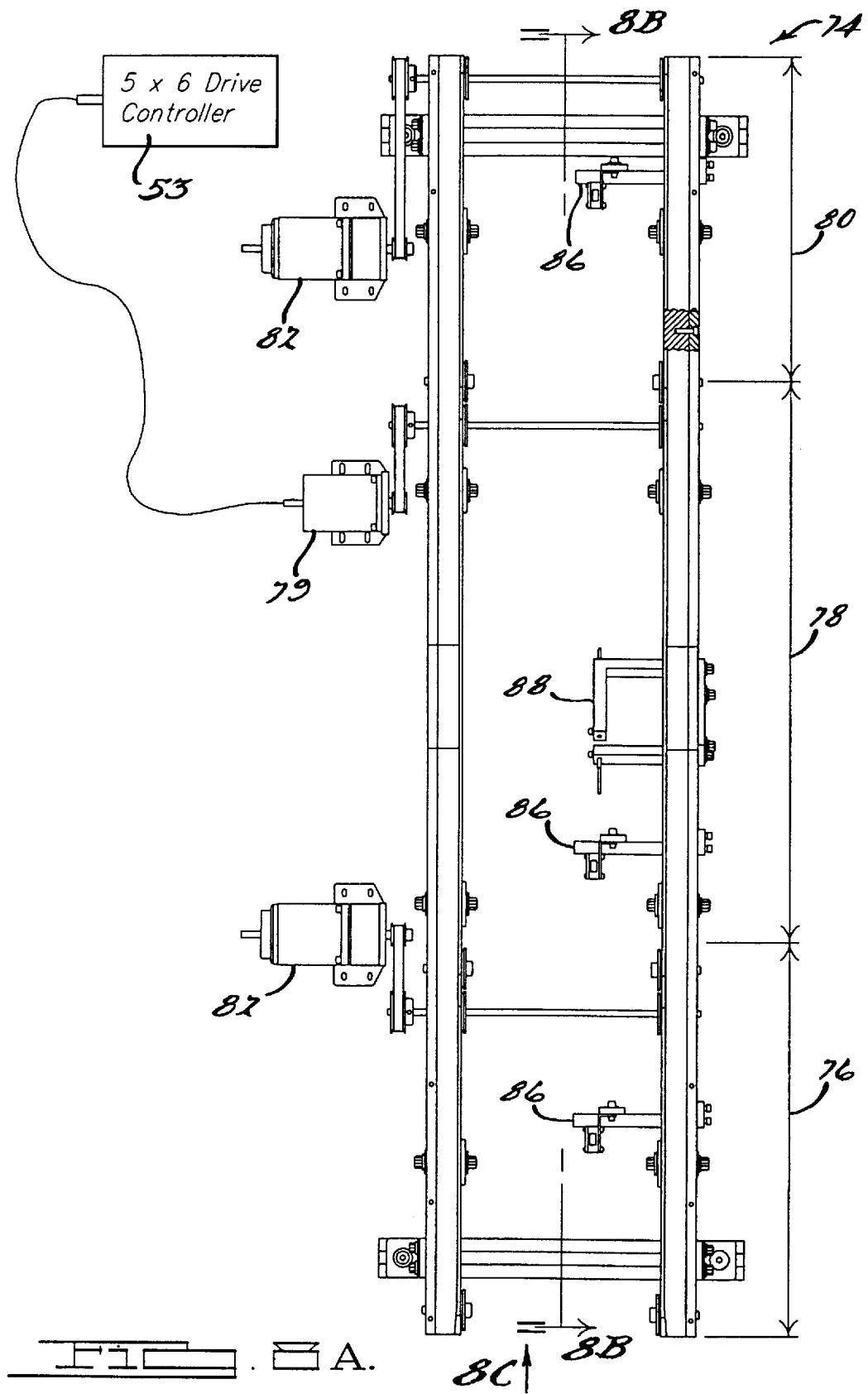

INTEGRATED MACHINE VISION INSPECTION AND REWORK SYSTEM — CIP

FIELD OF INVENTION

This application is a continuation-in-part of U.S. patent application Ser. No. 08/324,435, filed Oct. 17, 1994 now abandoned. The present invention relates to an integrated machine vision inspection and rework system for inspecting and reworking electronic printed circuits boards. More particularly, the present invention relates to a novel method and apparatus for inspecting printed circuit boards to identify faults in the mounting or placement of components or the screening of solder paste on the printed circuit boards, or both, and for reworking these boards to correct the identified faults.

BACKGROUND OF THE INVENTION

Referring to FIG. 1, early machine vision inspection and rework systems 20, such as those manufactured exclusively for Chrysler Corporation by IRI (International Robamation Intelligence) of Carlsbad, Calif., were comprised of four separate units: the inspection structure 22, the computer, controller and air conditioning unit 24, the rework station 26, and the uninterruptable power supply unit 36. These separate units 22, 24, 26 and 36 were interconnected by various conveyor and material handling devices 28 that transported the printed circuit boards 30.

Boards 30 that passed inspection were transported by the conveyors 28 to the next assembly operation. Boards 30 having faults were diverted from the main trunk of the assembly line into a printed circuit board buffer station 32 for temporary storage. The defective boards were then forwarded into the rework station 26 for repair. After an operator 34 at the rework station 26 manually repaired the fault or faults on the board 30, it was transported back to the main trunk of the conveyor 28 where the board 30 was reinspected at the inspection station 22. An uninterruptable power supply 36 provided clean power and, in case of power failure, battery backup for the entire system 20.

These early machine vision inspection and rework systems occupied considerable floor space and proved disadvantageous due to their slow computer processing times, which limited product yield and the number of available PC component inspections. In addition, the cost of the machine vision and material handing components could not be justified for partial inspection of densely populated printed circuit boards.

Therefore, to reduce printed circuit board inspection cycle times, and to increase product yields and the number of components inspected per cycle, a completely in-line integrated machine vision inspection and rework system is desired having a high speed asynchronous conveyor design, a compact stand-alone footprint, and a dual fault rework reporting scheme.

SUMMARY OF THE INVENTION

An integrated machine vision inspection and rework system is provided for inspecting and reworking printed circuit boards. The system comprises an inspection unit, which acquires image data of the printed circuit board, attached to a framed machine base. A vision computer for processing the image data acquired by the inspection unit is contained within a chamber in the machine framework. The system also comprises a three stage asynchronous conveyor with sensors that communicate with the vision computer. The vision computer communicates with conveyor drive and stepping motors through drive controller and I/O boards that provide precision asynchronous control capability for moving the three stage conveyor. The vision computer is thus able to position the conveyor carrying the printed circuit boards precisely at predetermined locations under the inspection unit. A rework station, attached to the machine framework, includes a dual reporting scheme with both a laser indicator and a fault display monitor.

BRIEF DESCRIPTION OF THE DRAWINGS

FIG. 2B is a partial back view in the direction of arrow of 2B of FIG. 3 showing the integrated machine vision inspection and rework system with the computer and controller chamber access doors partially broken away.

FIG. 5 is a plan view of a printed circuit board showing dual rows of registration fiducials and the composite 2-dimensional web.

FIG. 6A is a top view of the dual circle parts presenter disk.

FIG. 6B is a side view of the dual circle parts presenter disk of FIG. 6A.

FIG. 6C and 6D are a detail of the parts presenter access bin shown in circle 6C of FIG. 6A.

FIG. 8A is a top view of the three stage conveyor shown in FIG. 3.

FIG. 8C is an end view in the direction of arrow 8C of FIG. 8A showing the three stage conveyor.

DETAILED DESCRIPTION OF THE PREFERRED EMBODIMENT

Figure 1:
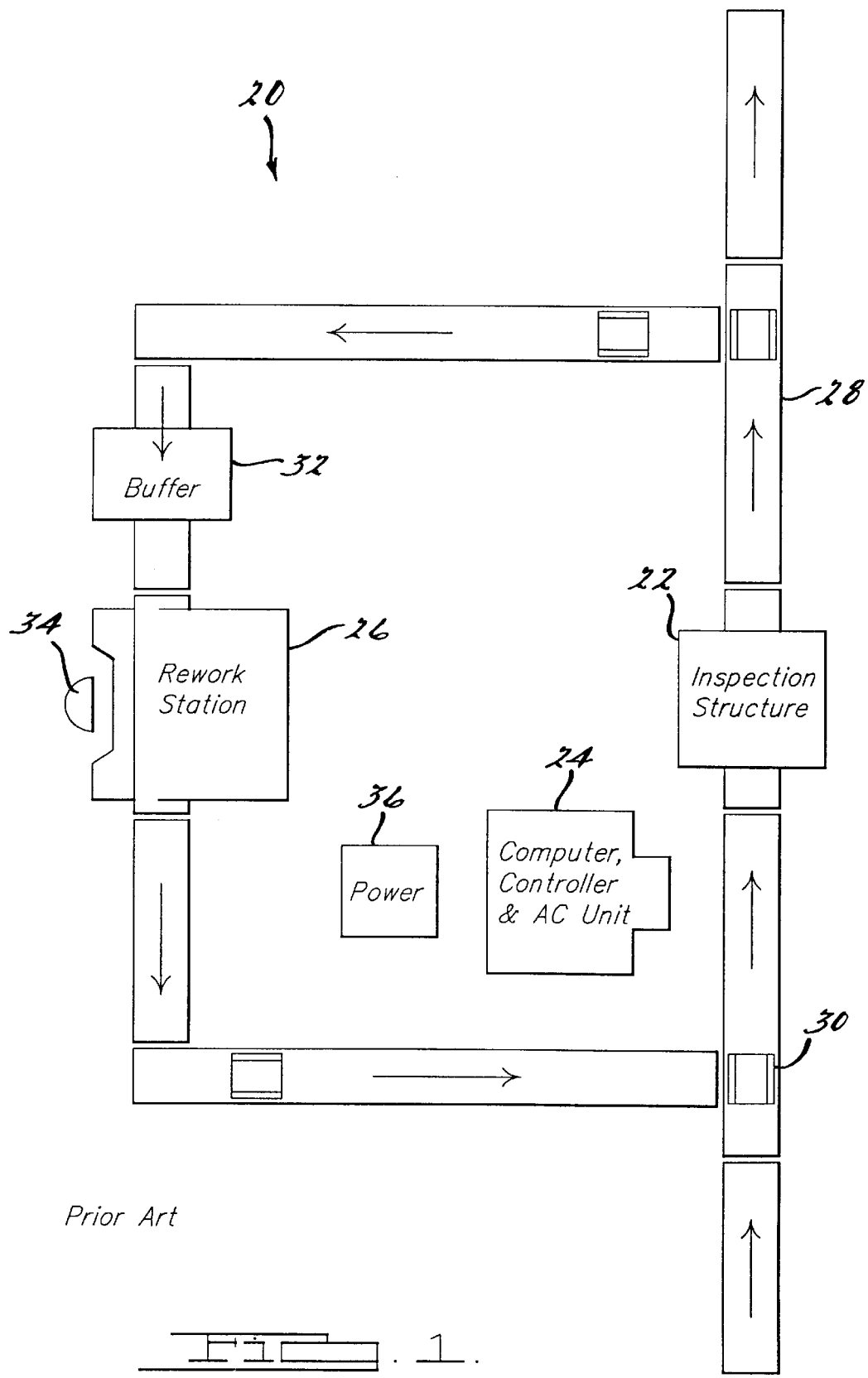
FIG. 1 is a plan view of a prior art machine vision inspection and rework system that is interconnected by a conveyor system having a synchronous conveyor that runs under the inspection unit.

Referring now to the drawings in which like reference numerals represent the same components among the several views, FIGS. 2A, 2B, 3, and 4 depict the present invention entitled the integrated machine vision inspection and rework system 40. The present invention 40 captures images of Surface Mounted Device (SMD) components and or leaded parts and compares the digitized image of the components and their location on the printed circuit board 30 against a database of master artwork. Printed circuit boards 30 that are determined during inspection to have errors or faults are diverted to a rework station 52 where the errors are automatically displayed on a monitor and then are manually corrected by an operator 34.

The architecture of the integrated machine vision inspection and rework system 40 provides a configuration in which a machine vision image data acquisition unit 48, a rework station 52, vision computers 42, motor controllers 53 and 84 and I/O boards 44 are combined into a compact unit whose footprint is defined by the extent of computer and controller chambers 46 and various conveyor extensions 45 and divert conveyors 49. A convenient stand-alone system is thereby created, which is easily incorporated into an existing manufacturing assembly line.

The integrated machine vision inspection and rework system 40 includes a number of vision computers 42 and I/O boards 44 housed in the framed computer and controller chambers 46. Mounted on the top plate of the computer and controller chambers 46 is the machine vision image data acquisition unit 48, which is described in detail in a U.S. patent application Ser. No. 08/321,648, now abandoned filed by Chrysler Corporation on Oct. 11, 1994 incorporated herein by reference. The image acquisition unit 48 is enclosed within an image acquisition enclosure 50.

Referring now to FIGS. 2, 3, 4, and 8A–C, printed circuits boards 30 are transported under the acquisition unit 48 on a three stage conveyor system 74. This conveyor system 74 is comprised of a synchronous input queue conveyor section 76 feeding an asynchronous smart conveyor section 78 running under the acquisition unit 48 and a synchronous output buffer conveyor section 80 located downstream from the asynchronous smart conveyor section 78 to receive the printed circuit boards 30 from the asynchronous smart conveyor section 78. The printed circuit boards 30 advance from the synchronous output buffer conveyor section 80 to conveyor extensions 45 where they are sorted and routed along two different paths. Printed circuit boards 30 that passed inspection parameters are transported to the main manufacturing assembly line conveyor 43 while those that were determined to have errors or faults are transported via the divert conveyor 49 to a PC board buffer unit 41 to await rework operations. The asynchronous smart conveyor section 78 allows the inspection cycle time of the acquisition unit 48 to be independent of the rate of the main manufacturing assembly line's upstream and downstream conveyors 43. Reworked PC boards 30 are transported via the divert conveyor 49 back to the main manufacturing assembly line conveyor 43 for reinspection.

In the preferred embodiment, the synchronous input queue conveyor section 76 and the output buffer conveyor sections 80 are both about 13 inches long. Each of these conveyor sections 76 and 80 is driven by an adjustable fixed speed AC drive motor 82 controlled by a separate drive motor controller 84. Each of the drive motor controllers 84 is connected to an I/O board 44 and housed with the I/O boards 44 in the computer and controller chambers 46.

The asynchronous smart conveyor section 78, which is about 23 inches long, is driven by a PH268-E068B stepping motor 79 having 400 steps (i.e., having a 0.9 degree base step) and is controlled by a SX6 drive controller 53 with microstepping capability. The SX6 drive controller 53 is connected through an I/O board 44 to one of the vision computers 42 in the computer and controller chambers 46. Thus, the overall length for the preferred embodiment of the three stage conveyor system 74 is approximately 49 inches.

Mounted on the three stage conveyor system 74 are three photo sensors 86 that output detection signals to relay modules on the appropriate I/O board 44 when a printed circuit board 30 enters the input queue 76, the output buffer 78, or the smart conveyor sections 80. In response to a detection signal, the I/O board 44 outputs a control signal to the appropriate synchronous drive motor controller 84 to start or stop the corresponding drive motor 82.

Mounted on the asynchronous smart conveyor section 78 is a fiber optic through-beam sensor 88 that outputs a signal to a vision computer 42 when a printed circuit board 30 breaks a laser beam by passing through it. In response, the vision computer 42 outputs a control signal to the smart conveyor stepping motor 79. The smart conveyor stepping motor 79 is controlled by a SX6 drive controller 53 purchased from Compumotor, a division of Parker Hannafin. Thus, when the photo sensor 86 in the smart conveyor section 78 detects the leading edge of a printed circuit board 30, the drive motor controller 53 accelerates the printed circuit board 30 under the inspection unit 48. When the printed circuit board 30 breaks the beam of the fiber optic through-beam sensor 88, the vision computer 42 slows the rate of the smart conveyor section 78. As the printed circuit board 34 is indexed under the acquisition unit 48, the strobe power supply 89 is synchronously flashed at predetermined locations to permit the inspection unit 48 to acquire image data. The asynchronous microstepping control of the stepper motor 79, provided by the SX6 drive controller 53 under the control of the vision computers 42, advantageously allows the inspection rate of the printed circuit boards 30 to be variably programmed and independent of the speed of the main manufacturing assembly line's upstream and downstream conveyors 43.

The single stage rework conveyor unit 90, which transports printed circuit boards 30 through the rework station 52, uses an arrangement comprised of a drive motor 82, a rework drive motor controller 85, an I/O board 44, and vision computer 42 interconnected in manner similar to the arrangement utilized in the present invention for the input queue 78 and output buffer conveyor sections 80, as described above.

Figure 4:
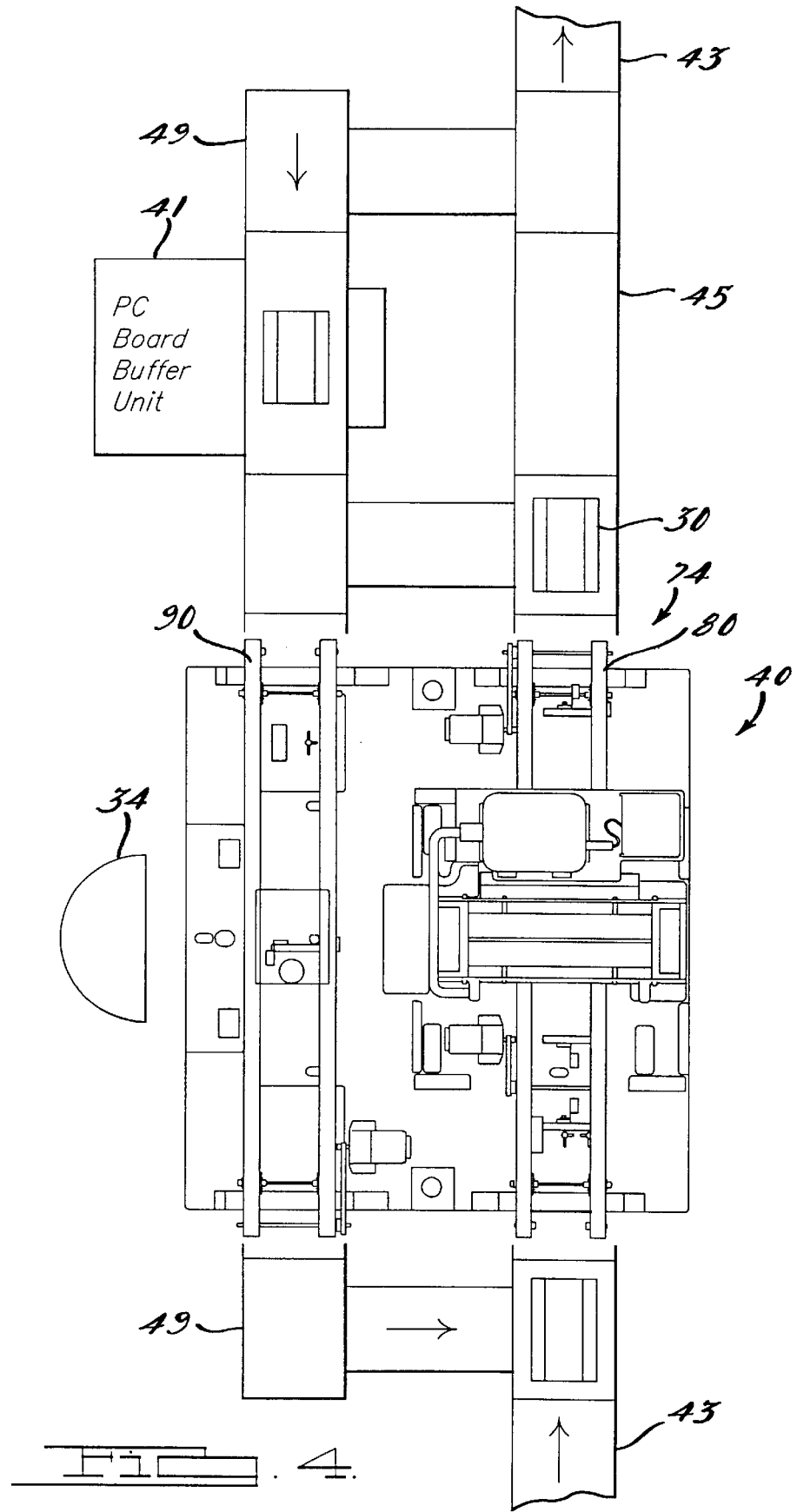
FIG. 4 is a plan view of the integrated machine vision inspection and rework system showing the closed rework processing loop and the conveyor extensions that connect the present invention to the main manufacturing assembly line.
Figures 7A, 7B:
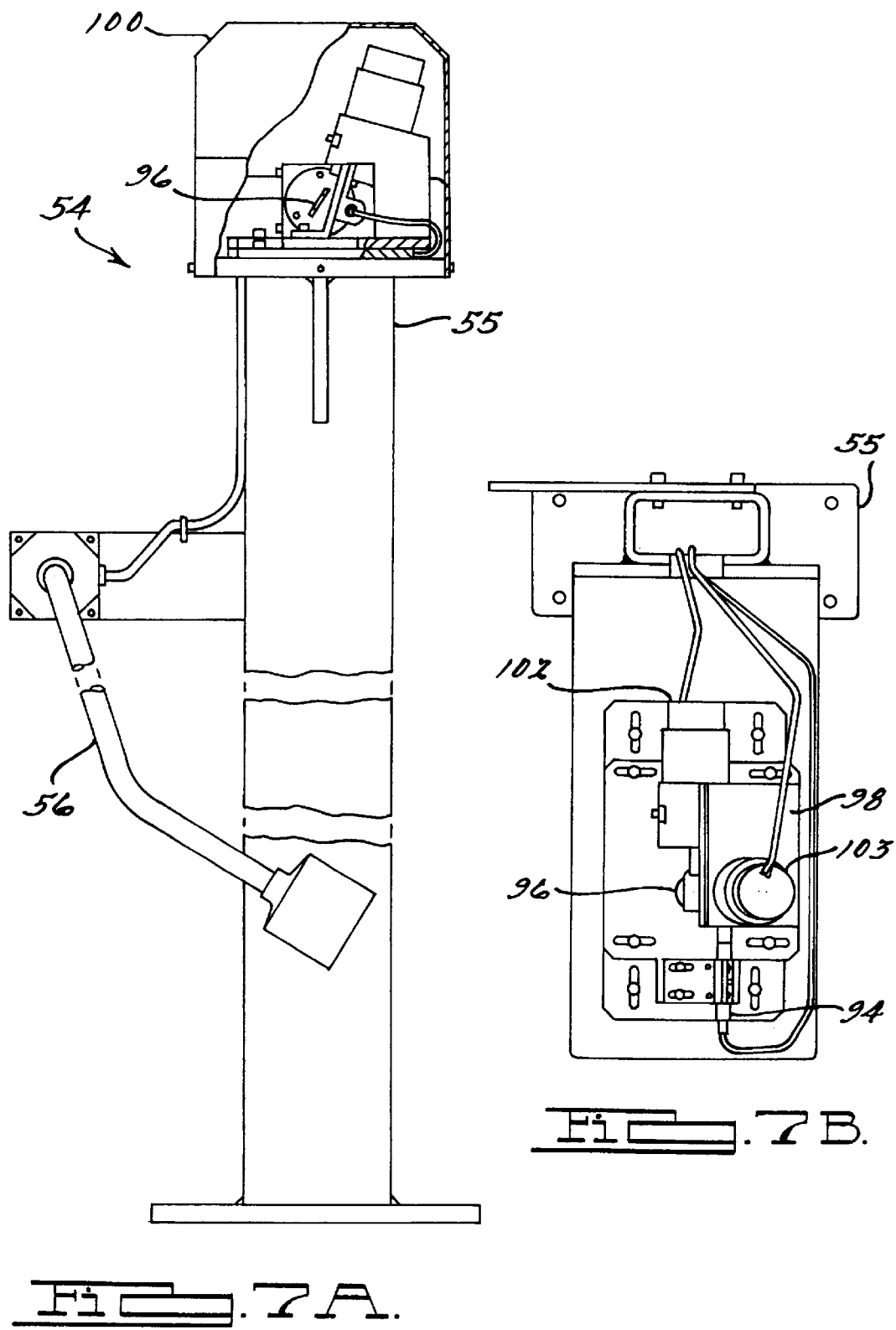
FIG. 7A is a front view of the laser projector assembly shown in FIG. 2A with the laser enclosure partially broken away.
FIG. 7B is a top view of the laser projector assembly with the laser enclosure removed for clarity.
Figure 7C:
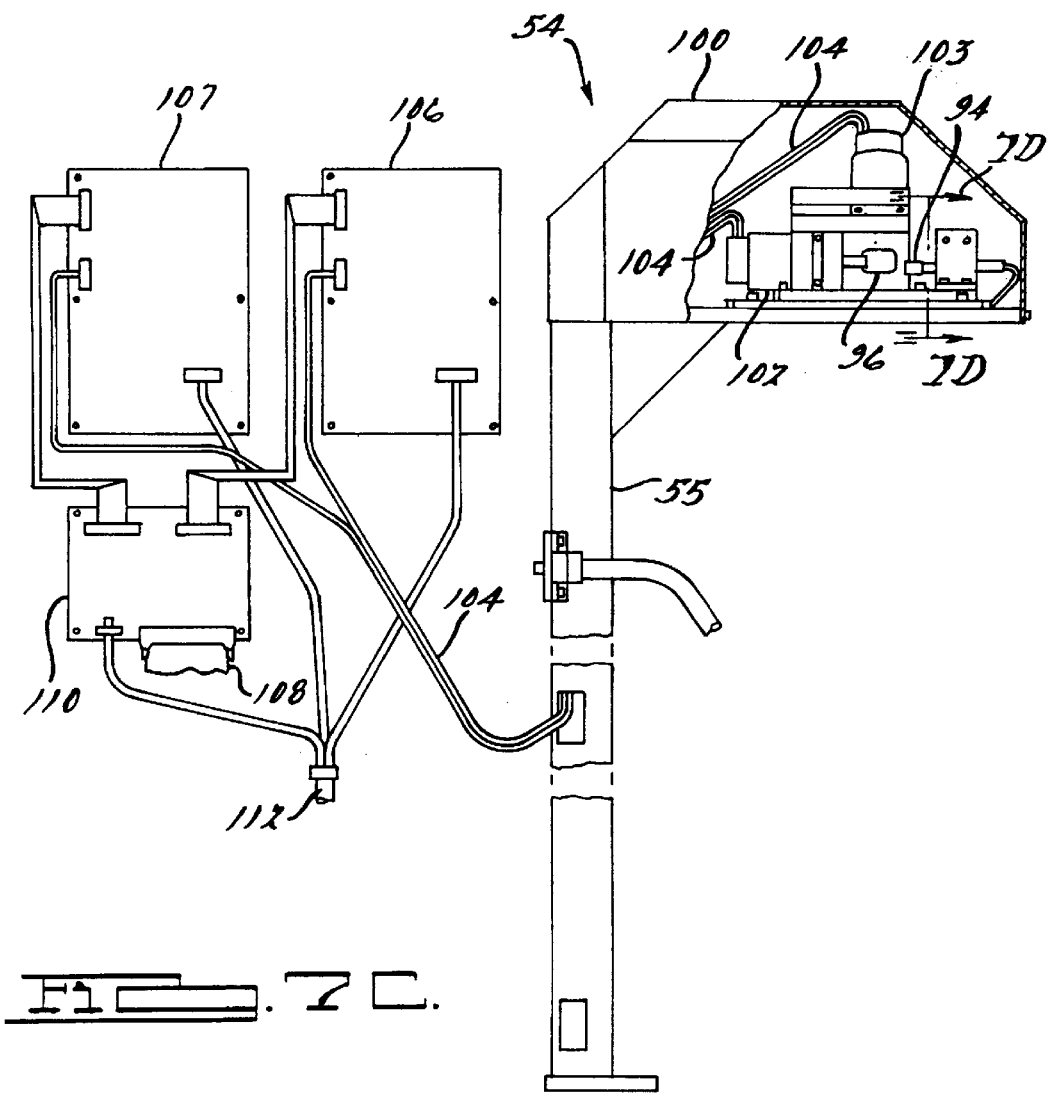
FIG. 7C is a side view of the laser projector assembly showing the laser enclosure partially broken away and further showing the laser projector assembly's connections to the galvanometer controller boards and the vision computer interface board.
Figure 7D:
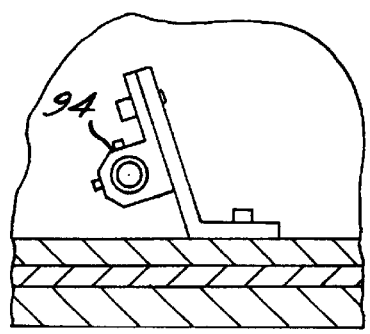
FIG. 7D is a view in the direction of arrows 7D—7D of FIG. 7C showing the mounting arrangement for the laser diode.
Figure 8B:
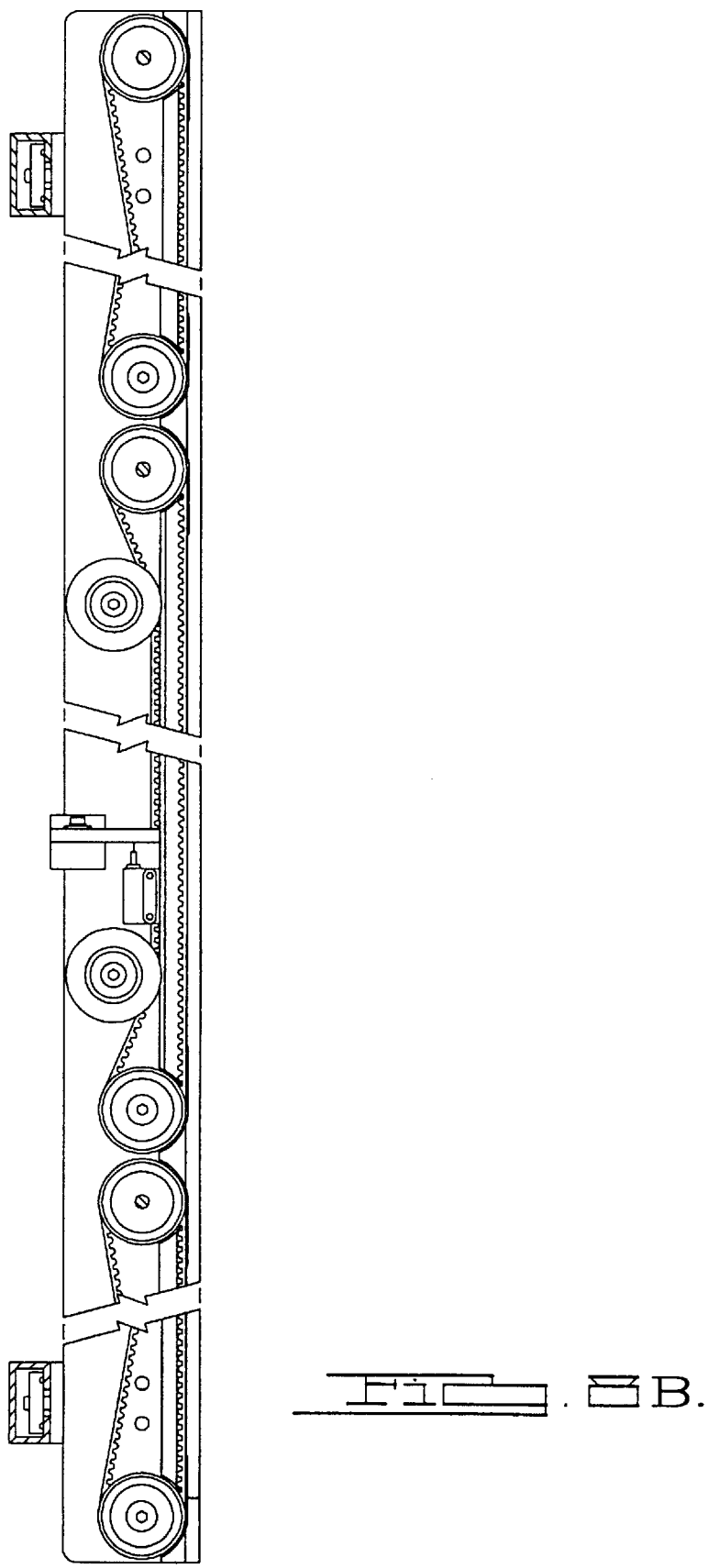
FIG. 8B is cross-sectional view in the direction of arrows 8B—8B of FIG. 8A showing the three stage conveyor.

Referring now to FIG. 4, the divert conveyors 49 connect the integrated machine vision inspection and rework system 40 into the existing manufacturing assembly line 43. A PC board buffer unit 41, built according to principles well know in the art, stores the printed circuit boards 30 on which errors or faults have been detected. In response to a cue from the operator 34, the fault-detected printed circuit boards 30 are forwarded from the PC board buffer unit 41 into the rework station 52 via the rework conveyor unit 90. After the operator 34 has manually repaired the indicated fault(s), he or she routes the printed circuit board 30 back to the synchronous input conveyor queue conveyor section 76 via a divert conveyor 49 where the printed circuit board 30 is again feed into the asynchronous smart conveyor section 76 for reinspected by the acquisition unit 48. This 100% closed loop inspection and repair cycle is designed to ensure throughput of printed circuits boards 30 having zero errors or faults. If an error is detected during reinspection, the printed circuit board 30 is again shuttled back to the rework station 52 for repair.

A printed circuit board 30 entering the asynchronous smart conveyor section 78 breaks the beam of a fiber optic sensor 88 causing a signal to be sent to the vision computer 42 that precisely locates the leading edge of the board 30. The vision computer 42 sends a command signal to the drive motor controller 53, which energizes the smart conveyor stepping motor 79 with the appropriate number of micropulses to place the printed circuit board 30 directly under the acquisition unit 48.

Referring now to FIG. 5, printed circuit boards 30 have a parallel grid matrix 116 comprised of two rows of fiducials 118 located on the edges of the board 30 adjacent to the rails of conveyor section 78. The fiducials 118 are strobed by the image data acquisition unit 48 and registered by the vision computer 42 repeatedly as the printed circuit board 30 is indexed under the acquisition unit 48.

The actual position of each starting fiducial 120 on the printed circuit board 30 is registered and compared to the true position of the starting fiducial 120 stored in a master database in the memory of the machine vision computer 42. Based on this comparison, the vision computer 42 determines the offset from the X and Y axes for each scan of the acquisition unit 48. The vision computer 42 then compensates for these offsets when determining the actual position of individual electronic SMD components on the printed circuit board 30.

At least two large starting fiducials 120, one located on each side of the board's leading edge, are typically used to locate the PC board initially and to ensure correct relative alignment of the physical board 30 to the master database stored in memory. Following the starting fiducials 120 is a series of smaller snap fiducials 122, which are spaced along the center lines of the parallel grid matrix 116. The smaller snap fiducials 122 are used with feed forward program routines to more precisely register and track the printed circuit board 30 during inspection as it is indexed via the asynchronous smart conveyor section 78 under the acquisition unit 48. The feed forward feature also allows for variable speed control of the smart conveyor section 78, thereby increasing the throughput of the acquisition unit 48.

Visual spectrum data representing a 2-dimensional camera scan 124 or strip across the printed circuit board 30 is collected by multiple cameras mounted within the acquisition unit 48. The cameras are snapped synchronously with the flashing of the strobe power supply 89. The vision computer 42 assembles the overlapping fields of view 126 of individual cameras mounted within the acquisition unit 48 into an image representing the continuous camera scan 124 across the printed circuit board 30.

The vision computer 42 sends a series of command signals to the drive motor controller 53 to cycle the smart conveyor stepping motor 79 and cause the asynchronous smart conveyor 78 to index the printed circuit board 30 continuously forward under the acquisition unit 48. As the printed circuit board 30 is indexed forward, the vision computer 42 constructs a composite 2-dimensional web 128 of sensor coverage from the successive camera scans 124. The multiple camera scans 124 collected by the acquisition unit 48 are assembled by the vision computer 42 into the composite 2-dimensional web 128 by correlating the position of the snap fiducials 122 located at each row of the parallel grid matrix 116 between successive camera scans 124.

Figure 2A:
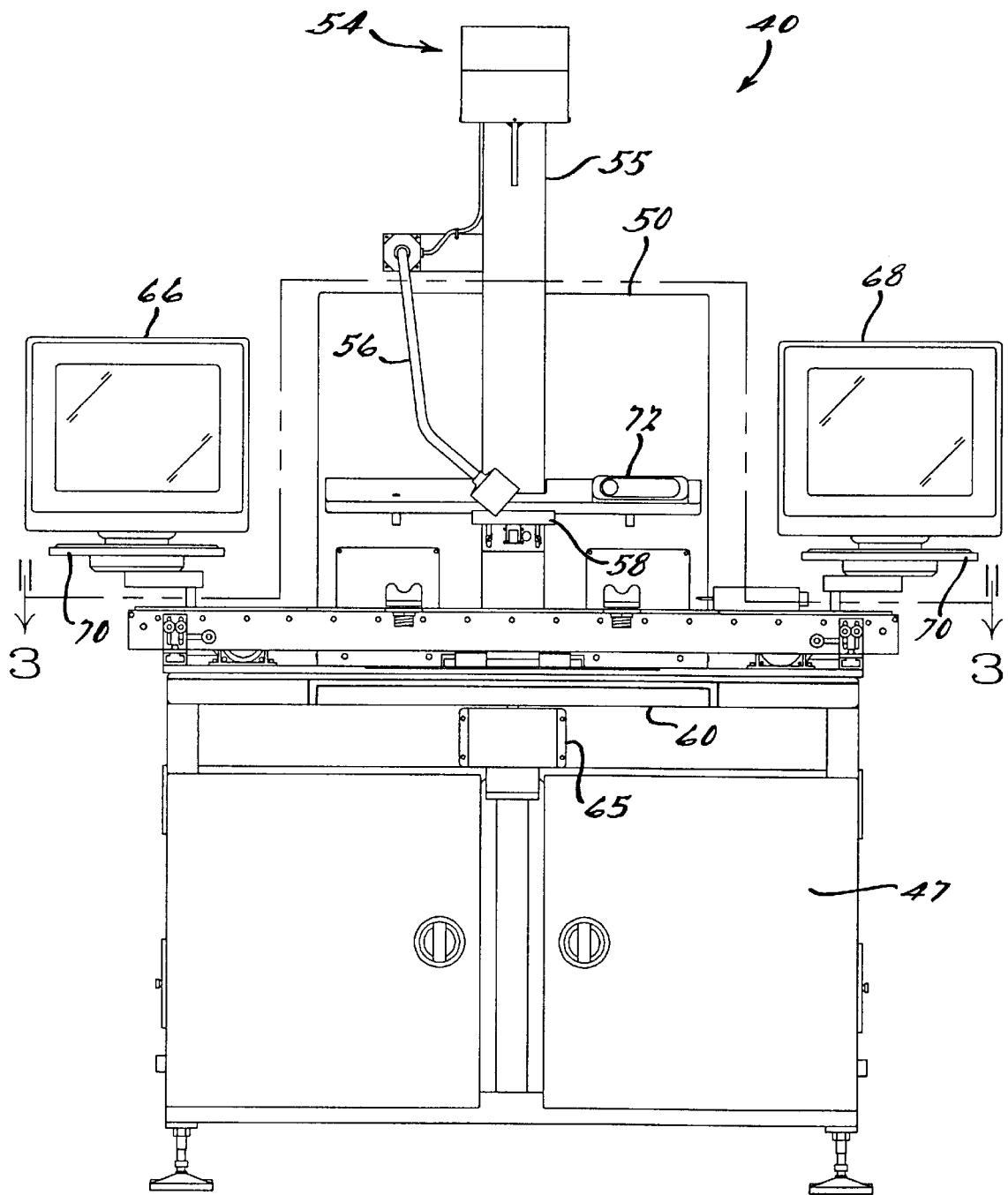
FIG. 2A is a front view in the direction of arrow of 2A of FIG. 3 showing the integrated machine vision inspection and rework system of the present invention.
Figure 3:
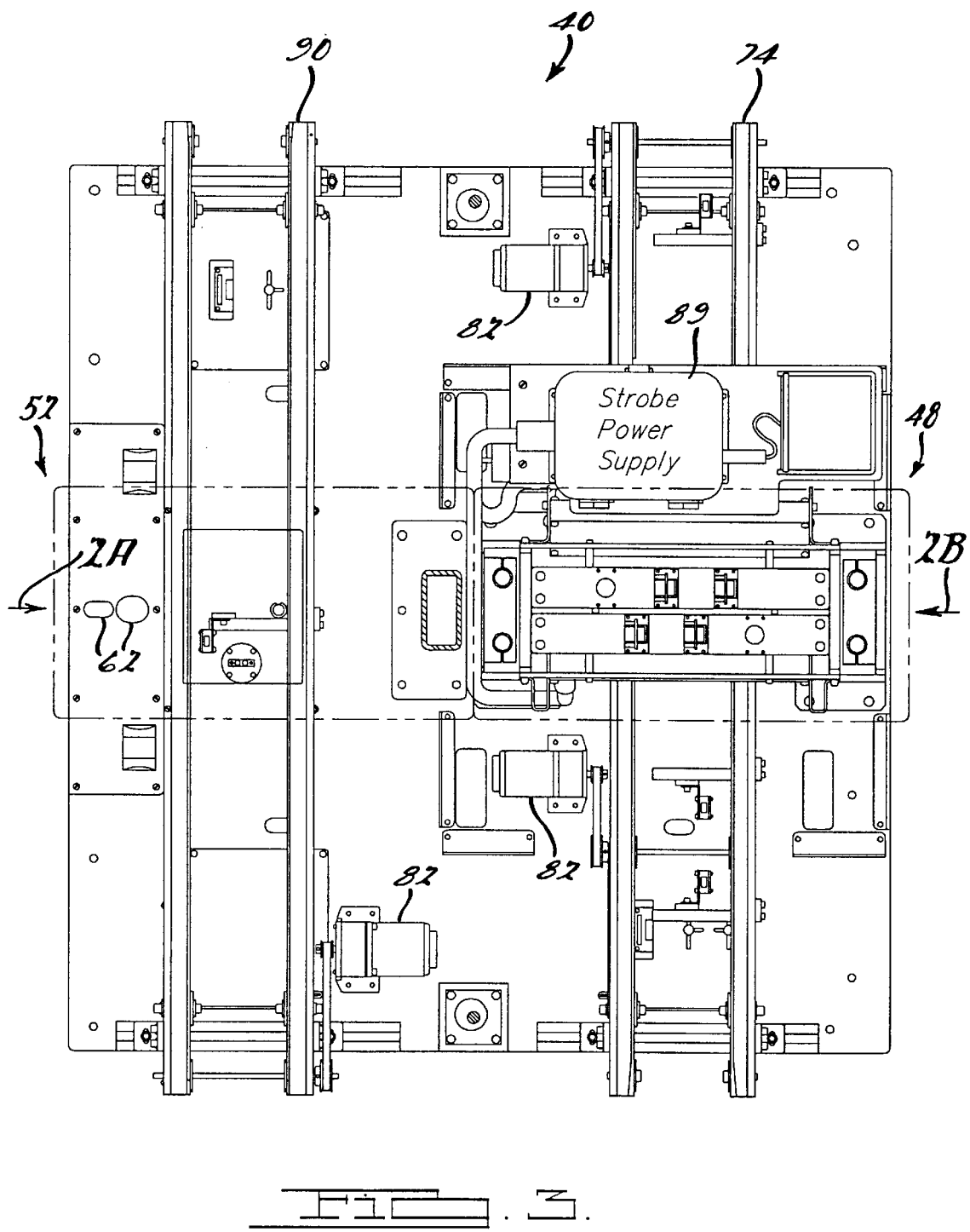
FIG. 3 is a top view of the integrated machine vision inspection and rework system in the direction of arrows 3—3 of FIG. 2A.

Referring now to FIG. 2A, an inspection display monitor 68 is mounted on a hinged and jointed articulating monitor platform 70 that is attached to the top plate of the computer and controller chambers 46. A trackball or mouse 72 used by the operator 34 to communicate with the vision computer 42 is placed on a shelf attached to the image acquisition enclosure 50. The inspection monitor 68 displays to the operator an overlay of the composite 2-dimensional web 128 and the position of the fiducials 118 and individual SMD components 130 on the printed circuit board 30.

Referring again to FIGS. 2A and 3, also mounted on the top plate of the frame 46 is a rework station 52 that includes a laser scanner assembly 54 and a rework display monitor 66. An error or fault on the printed circuit board 30 is indicated to the operator 34 by both the laser scanner assembly 54 and the rework display monitor 66. An error or fault is defined as any over-tolerance condition or any missing part or extra part (wrong database) deviation existing between the master artwork stored in the vision computers 42 and the position of the actual components as measured by the acquisition unit 48. The laser assembly 54 points a laser beam at the location of the error or fault on the printed circuit board 30 while the repair display monitor 66 presents to the operator 34 a map of the printed circuit board 30 that highlights in contrasting colors the various fault conditions. This dual fault reporting system is technically advantageous over earlier systems that relied solely on single heliumneon laser fault indicators, which tended to drift off calibration and lose power, making repairs difficult.

To enable the operator 34 to repair an indicated error or fault, a goose necked rework light 56 and a rework magnifying glass 58 are installed on the weldment 55 forming the base of the laser scanner assembly 54. A dual circle component presentation disk 60, detailed in FIGS. 6A–C, rotated into alignment by an Oriental Motors PH296–02GK DC stepping motor 65 with a 4GK-30KA gearhead. The disk 60 is programed to rotate until the part bin 64 holding the component needed for the indicated repair lines up with one of the component presentation access gates 62 in the top plate of the frame 46. The presentation disk's stepping motor 65 is controlled by a SX6 drive controller 53, which is connected to one of the vision computers 42 through an I/O board 44.

Referring now to FIGS. 2A and 7A–D, at the heart of the laser projector assembly 54 is a laser diode 94 whose beam is projected on mirrors 96 first on the X axis galvanometer 102 and then on the Y axis galvanometer 103 of the X/Y stage assemblies 98 and ultimately focused on the printed circuit board plane of the rework conveyor unit 90. The laser diode 94 and the X/Y stage assemblies 98 are mounted on adjustable calibration plates of the laser assembly weldment 55 and enclosed by a laser enclosure 100. The output shafts of the galvanometers 102 and 103 control the orientation of the mirror 96 along the X and Y axes and thus the direction of the laser beam emitted from the laser diode 94 as it is reflected toward the printed circuit board 30 below. The laser diode 94 used in the preferred embodiment is a 5VDC, 3 mWatt laser diode Model 06DLB102/P purchased by Chrysler from Melles Groit, Inc. of Bolder, Colo., which operates at a wavelength of 675 nm and has a beam size of 1.00×3.3 mm. The X/Y stage is a standard Model 6104 dual axis stage unit with Model 6450 electric galvanometers 102 and 103 purchased from Cambridge Technologies Inc., of Watertown, Mass.

The galvanometers 102 and 103 are each connected via a drive cable 104 to the X and Y axis drive boards, 106 and 107 respectively. The X and Y drive boards 106 and 107 are each connected with a ribbon cable to the X/Y scanner interface board 110. The X drive, Y drive and X/Y scanner interface boards, 106, 107 and 110 respectively, are connected with a board power cable 112 to the vision computers 42 housed within the computer and controller chambers 46. The X and Y axis drive boards 106 and 107, are Model 6504B controller boards, also purchased from Cambridge Technology, Inc. The X/Y scanner interface board 110 was designed by Chrysler Corporation in accordance with principals well known in the art to provide an interface between the vision computer 42 and the X and Y drive boards, 106 and 107 respectively. The vision computers 42 send command signals to the X/Y scanner interface board 110, which resolves component location data into X and Y control signals for transmission to the X and Y axis drive boards 106 and 107. The X and Y drive boards 106 and 107 compute X and Y angular displacement distances and output control signals to the X and Y galvanometers 102 and 103, which are coupled through their output shafts to the mirrors 96.

The present invention overcomes many of the problems inherent in early machine vision inspection and rework systems that utilized synchronous conveyor systems to route printed circuit boards under an inspection unit. To reduce cycle times, elaborate schemes were used in these early systems to track and route as many as five boards through the inspection unit. The early systems were prone to many material handling and computer tracking problems since the printed circuit boards had to be equally spaced as they passed through the inspection area. In particular, vision computer tracking problems were commonly caused by boards running together when a downstream assembly line conveyer suddenly stopped or when the inspection sequence was temporarily interrupted.

The present invention is also advantageous compared to early machine vision and rework systems in reducing operator fatigue and dissatisfaction caused by board jams in the inspection unit. In early systems, the operator had to walk around the entire inspection rework loop to an inspection station that was typically located many feet away from the rework station. In addition to its reduced footprint, the present invention has greatly minimized the actual number of boards jams.

Alternative constructions of the present invention, of course, will be apparent to those skilled in the art who should realize that a variation made to the disclosed embodiment may still properly fall within the scope of the present invention as defined by the claims, which follow.

Points of Novelty 1) reduced loop concept which combines the inspection structure, computer/control and power distribution unit, and repair station into a single stand-alone unit saving floor space (100% closed loop process—100% of errors detected)

2) precision movement of conveyor with respect to printed circuit board registration fiducials 3) use of the monitor to calibrate the system by aligning the fiducials with software windows 4) 2-D inspection area or web of sensor coverage 5) dual laser indicator and monitor display fault reporting system (integrated laser beam projector and monitor display reporting system don't have to rely on laser: if laser fails loose power: back up system on repair monitor on display graph cross-hairs)

6) flexible/interchange center stage for different resolution 7) flexible computer system by + or − parallel computer boards can increase speed or introduce wider board sizes 8) single large board enough to run vision computer; multiple boards run in parallel increases speed—IRI had 28 PC boards to run computer system: 17 different kinds. (1) board with 8 cameras plugged into it (1 minute) compared to 2 boards with 4 cameras plugged into it (0.5 minute).

We claim:

1. An integrated machine vision inspection and rework system for inspecting and reworking a printed circuit board populated with at least one component, comprising:

a machine base;

an inspection unit, attached to said base, for acquiring image data of the printed circuit board and component;

processing means, contained within said base, for processing image data acquired by said inspection unit; and an asynchronous conveyor, in communication with said processing means, for transporting the printed circuit board to predetermined locations under said inspection unit, said asynchronous conveyor comprising:

conveyor means;

asynchronous drive means, coupled to said conveyor means, for moving asynchronously said conveyor means;

first control means, coupled to said drive means and in communication with said processing means, for controlling a position of said conveyor means;

a plurality of sensing means, in communication with said control means, for communicating a location of the printed circuit board to said first control means;

said system further comprising:

first and second buffer conveyor means for transporting and holding the printed circuit board;

first and second variable drive means coupled to said first and second buffer conveyor means, respectively, for synchronously moving said first and second buffer conveyor means, respectively;

first adjustment means in communication with said first buffer conveyor means and at least one of said plurality of sensing means for controlling a speed of said first buffer conveyor means; and second adjustment means in communication with said second buffer conveyor means and at least one of said plurality of sensing means for controlling a speed of said second buffer conveyor means.

2. The system of claim 1, further comprising:

a rework station, attached to said base and in communication with said inspection unit, for displaying inspection results.

3. The system of claim 1, wherein the printed circuit board includes an actual registration point that relates precisely to the actual position of the component.

4. The system of claim 3, further comprising:

storage means, in communication with said processing means, for storing master art work of an ideal printed circuit board that has an ideal registration point which relates precisely to an ideal position of the component.

5. The system of claim 4, wherein said processing means includes at least one instruction that compares said actual registration point with said ideal registration point to determine any deviation between said actual and said ideal positions.

6. The system of claim 5 further comprising:

a rework station attached to said base and in communication with said inspection unit for displaying inspection results;

display means, in communication with said processing means, for displaying at least part of said master art work and said deviation;

indicator means, in communication with said processor means, for indicating a location of said deviation; and component presentation means, attached to said machine base, for presenting to an operator a component being identified by said processing means.

7. The system of claim 5, wherein said storage means includes a spatial model that can be coordinated to said master art work.

8. The system of claim 7, wherein said display means is used to calibrate said spatial model to said actual registration point.

9. An inspection and rework apparatus for inspecting and reworking a circuit board, comprising:

a base structure;

inspection means, mounted on said structure, for inspecting the circuit board;

a rework station, mounted on said structure, for indicating faults on the circuit board and displaying inspection results;

asynchronous conveyor means, in communication with said inspection means, for conveying said circuit board to predetermined locations, said synchronous conveyor means comprising:

conveyor means;

asynchronous drive means coupled to said conveyor means for asynchronously moving said conveyor means;

first control means coupled to said drive means and in communication with said inspection means for controlling a position of said conveyor means; and a plurality of sensing means in communication with said first control means for communicating a location of the printed circuit board to said first control means;

the apparatus further comprising:

first and second buffer conveyor means for transporting and holding the printed circuit board;

first and second variable drive means coupled respectively to said first and second buffer conveyor means for synchronously moving said first and second conveyor means, respectively;

first adjustment means in communication with said first buffer conveyor means and at least one of said plurality of sensing means for controlling a speed of said first buffer conveyor means; and second adjustment means in communication with said second buffer conveyor means and at least one of said plurality of sensing means for controlling a speed of said second buffer conveyor means.

10. The apparatus of claim 9, wherein the printed circuit board includes an actual registration point that relates precisely to an actual position of a component mounted to the circuit board.

11. The apparatus of claim 10, further comprising:

storage means, in communication with said inspection means, for storing master artwork of an ideal printed circuit board that has an ideal registration point which relates precisely to an ideal position of the component.

12. The apparatus of claim 11, wherein said inspection means includes at least one instruction that compares said actual registration point with said ideal registration point to determine any deviation between said actual and said ideal positions.

13. The apparatus of claim 12, said rework station comprising:

display means, in communication with said inspection means, for displaying at least part of said master artwork and said deviation;

indicator means, in communication with said inspection means, for indicating a location of said deviation; and component presentation means, attached to said base structure, for presenting to an operator a component being identified by said inspection means.

* * * * *